(12) United States Patent
Lin et al.

(10) Patent No.: US 8,536,460 B2
(45) Date of Patent: Sep. 17, 2013

(54) COMPOSITE DOUBLE-SIDED COPPER FOIL SUBSTRATES AND FLEXIBLE PRINTED CIRCUIT BOARD STRUCTURES USING THE SAME

(75) Inventors: Chih-Ming Lin, Hsinchu (TW); Shou-Jui Hsiang, Hsinchu (TW); Chien-Hui Lee, Hsinchu (TW)

(73) Assignee: Asia Electronic Material Co., Ltd., Hsinchu (TW)

( * ) Notice: Subject to any disclaimer, the term of this patent is extended or adjusted under 35 U.S.C. 154(b) by 357 days.

(21) Appl. No.: 12/915,467

(22) Filed: Oct. 29, 2010

(65) Prior Publication Data
US 2011/0114371 A1    May 19, 2011

(30) Foreign Application Priority Data
Nov. 17, 2009   (TW) .............................. 98221322 A

(51) Int. Cl.
*H05K 1/03*   (2006.01)
(52) U.S. Cl.
USPC ........................................ 174/255; 361/749

(58) Field of Classification Search
USPC .......................... 174/255, 259; 361/749–751
See application file for complete search history.

(56) References Cited

U.S. PATENT DOCUMENTS
7,103,971 B2 *   9/2006   Suzuki et al. ................... 29/852

* cited by examiner

*Primary Examiner* — Jeremy Norris
(74) *Attorney, Agent, or Firm* — Turocy & Watson, LLP

(57) ABSTRACT

A double-sided copper foil substrate, which comprises: a polymer layer; a first copper foil; an adhesive layer formed on the polymer layer such that the polymer layer is sandwiched between the adhesive layer and the first copper layer; and a second copper foil causing the adhesive layer to be sandwiched between the second copper foil and the polymer layer, wherein the polymer layer and the adhesive layer have a total thickness of from 12 to 25 μm. The present invention further provides a flexible printed circuit board structure utilizing the composite double-sided copper foil substrate of the present invention, wherein the second double-sided copper foil substrate has a trench for exposing a portion of the adhesive layer. The double-sided copper foil substrate of the present invention are lower in rebound and satisfying the demand for the greater number of bending and sliding cycles under a lower R angle, and particularly is suitable for thin and flexible electronic products.

7 Claims, 2 Drawing Sheets

COMPOSITE DOUBLE-SIDED COPPER FOIL SUBSTRATES AND FLEXIBLE PRINTED CIRCUIT BOARD STRUCTURES USING THE SAME

BACKGROUND OF THE INVENTION

1. Field of the Invention

This invention relates to double-sided copper foil substrates, and more particularly, to a composite double-sided copper foil substrate used for flexible printed circuit boards.

2. Description of Related Art

Recently, electronic systems are developed with a trend of compact size, high thermal resistance, versatility, high density, high reliability and low cost. Thus, the selection of a substrate is a very important factor.

A copper foil substrate used for manufacturing a flexible printed circuit board is classified into a single-sided copper foil substrate and a double-sided copper foil substrate, wherein the single-sided foil copper substrate or the double-sided copper foil substrate is selected in accordance with actual need. Regarding the manufacture process, the copper foil substrate is cut into a specific size and then a patterning process is executed. Compared to the single-sided copper foil substrate, the double-sided copper foil substrate can be formed with more circuits within a limited space, and thus the double-sided copper foil substrate is a primary intra substrate of the multi-layer board.

Currently, the structure of double-sided copper foil substrate 100 applied to the flexible printed circuit board, as shown in FIG. 1, is mainly manufactured by providing thermoplastic polyimide (TPI) films 102 on each of top and bottom surfaces of a thermosetting polyimide film 101 respectively and subsequently providing copper foils 103 on the surfaces opposing the thermosetting polyimide film 101 of each of the two polyimide films 102 such that a patterning process can be performed on the copper foils 103. However, since the advantages of a specific thermosetting polyimide film usage include having source limitation by international manufacturers such as American or Japanese manufacturers, the soaring cost and the fabrication facilities for the double-sided substrate manufactured by laminating, having problems in the yield rate thereof, are expensive, the cost of the flexible printed circuit increases such that the average cost of the resultant flexible printed board increases correspondingly Regarding another structure of double-sided copper foil substrate 200 applied to the flexible printed circuit board, as shown in FIG. 2, is manufactured by laminating copper foils 203 on the exterior sides of the combined polyimide layers 201 and 202 having different thermal expansion coefficients such that a patterning process is performed on the copper foils 203. However, since the thermal expansion coefficients of the polyimide layers 201 and 202 are asymmetric, a non-uniform stress may cause warpage and the bending R angle of less than 0.8 mm can not be achieved.

Therefore, there is still a need for a double-sided copper foil substrate having a greater number of bending cycles and siding cycles and the bended R angle is less than 0.8 mm.

SUMMARY OF THE INVENTION

In view of the abovementioned conventional defects, this invention provides a composite double-sided copper foil substrate, which comprises a polymer layer having a first surface and a second surface opposing the first surface, a first copper foil formed on the first surface of the polymer layer, a adhesive layer formed on the second surface of the polymer layer for the polymer layer sandwiched between the adhesive layer and the first copper foil, and a second copper foil formed on the adhesive layer for the adhesive layer sandwiched between the second copper foil and the polymer layer, wherein the polymer layer and the adhesive layer have a total thickness of from 12 to 25 μm.

In one embodiment, the thickness of the adhesive layer is in the range of from 3 to 12 μm.

In another embodiment, the thickness of the first copper foil is in the range of from 8 to 18 μm, and, preferably, the first copper foil is a rolled RA copper foil or a HA copper foil with high thermal resistance or durable flexibility.

In still another embodiment, the thickness of the second copper foil is also in the range of from 8 to 18 μm.

In addition, this invention further provides a flexible printed circuit board structure, which utilizes a composite double-sided copper foil substrate in this invention. And the second copper foil has a trench for exposing a portion of an adhesive layer from the second copper foil, such that the exposed portion of the adhesive layer is used as a bending section of the flexible printed circuit board.

The composite double-sided copper foil substrate of this invention can be manufactured in an easy process. Also, the thickness of the adhesive layer and polymer layer can be adjusted as desired, such that the copper foil substrate of this invention can satisfy demands for the greater number of bending and sliding cycles and siding and a bended R angle less than 0.8 mm, and particularly is suitable for those products which have demands for the bending or sliding of printed circuit boards.

EMBODIMENTS

Hereafter, this invention will be described with reference to specific embodiments, such that persons skilled in the art can easily understand advantages and effects of this invention disclosed in this specification. This invention also can be accomplished by other means; that is, it can be modified and varied without going beyond the scope of the disclosure of this invention.

Herein, the glass transition temperature (hereafter referred as Tg) is related to the thermal resistance of an adhesive layer. For this invention, it is a kind of transition temperature, particularly referring to a phase transformation temperature of a material. Specifically, while a material is heated or cooled and has changed up or down the critical temperature point, the phase of the material is transformed into a rubber phase or a hard and brittle glass phase.

Figure 3:
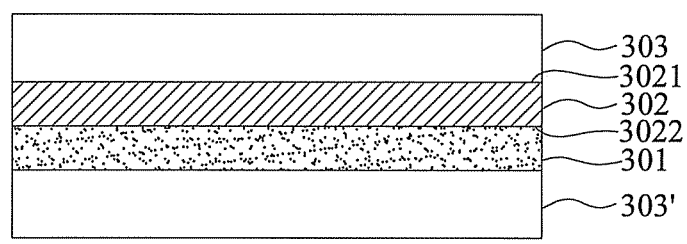
FIG. 3 is a cross-sectional schematic view of a double-sided copper foil substrate structure according to the present invention.

FIG. 3 shows a structure of a double-sided copper foil substrate 300 according to the present invention, the structure comprises: a first copper foil 303 and a polymer layer 302 having a first surface 3021 and a second surface 3022 opposing the first surface 3021 formed on the first copper foil 303; an adhesive layer 301 attached to the second surface 3022 of the polymer layer 302 such that the polymer layer 302 is sandwiched between the adhesive layer 301 and the first copper foil 303; and a second copper foil 303' formed on the adhesive layer 301 such that the adhesive layer 301 is sandwiched between the polymer layer 302 and the second copper foil 303'.

In order to reduce the occurrence of the reliability problems such as warpage and delamination in the manufactured flexible printed circuit board, the thickness and a composition of the adhesive layer in the double-sided copper foil substrate can be adjusted in accordance with the requirements of the double-sided copper foil substrate of this invention. In addition, in order to enhance the thermal resistance of the copper foil substrate of this invention, the adhesive layer preferably has a glass transition temperature which is higher than 170° C. And, the adhesive layer is made of at least a compound selected from the group consisting of epoxy resin, acrylic resin, urethane resin, silicone rubber resin, poly p-cycloxylene, bimaleimide resin and polyimide resin, wherein the polyimide resin is made of thermoplastic polyimide (TN). Further, a combination of the bimaleimide resin, acrylic resin or thermal plastic polyimide used as a mixed type adhesive layer is preferred. The adhesive layer according to one embodiment of the present invention has a thickness of from 3 to 12 μm, such that a copper foil substrate having superior functions can be provided under an effective cost-control strategy.

In the copper foil substrate, the material of the polymer layer is not particularly limited, but is preferably a thermal setting polyimide, and more preferably a thermal setting polyimide which is free from halogens. In one embodiment of this invention, the polymer layer has a thickness of from 5 to 15 μm. In another preferred embodiment, for example, a polymer layer having a thickness of from 10 to 14 μm is selected while the thickness of the adhesive layer is ranged from 9 to 12 μm.

Further, in one preferred embodiment, the first copper foil 303 has a thickness of from 8 to 18 μm, and the first copper foil is a rolled RA copper foil or a HA copper foil with high thermal resistance and high durable flexibility. As for the second copper foil, there is no particular limitation, and a conventional electrolytic copper foil can be used. In particular, the second copper foil preferably has a thickness of from 8 to 18 μm.

Figure 4A:
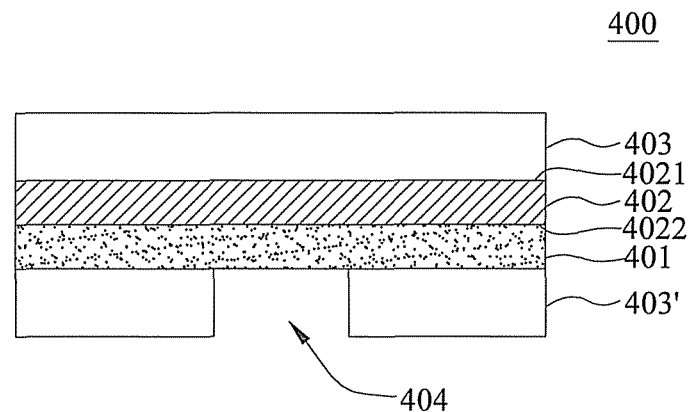
FIG. 4A is a cross-sectional schematic view of a flexible printed circuit board structure according to the present invention.
Figure 4B:
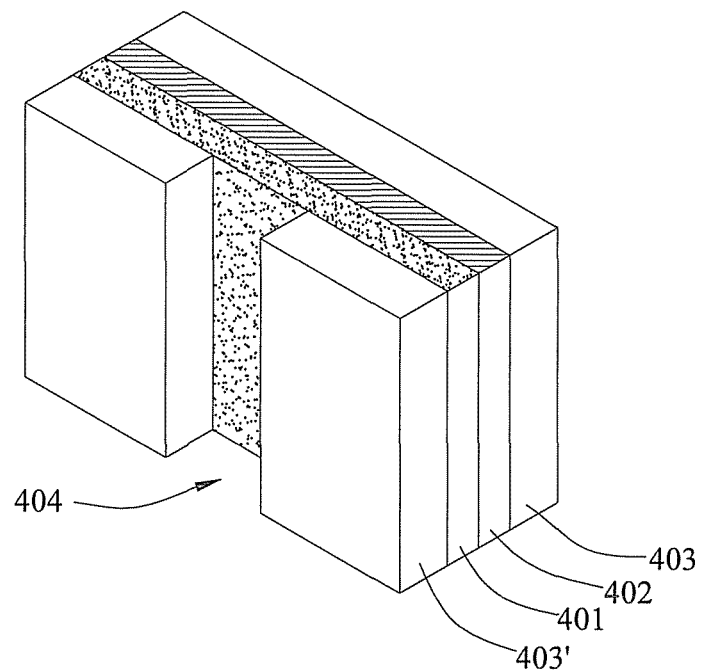
FIG. 4B is a three-dimensional schematic view of a flexible printed circuit board structure of FIG. 4A.

In another aspect of this invention, this invention further provides a flexible printed circuit board structure, which utilizes a composite double-sided copper foil substrate of this invention, wherein the second copper foil has a cut-off trench for exposing a portion of an adhesive layer from the second copper foil, such that the exposed portion of the adhesive layer is used as a bending section of the flexible printed circuit board. Specifically, as shown in FIGS. 4A and 4B, the structure of the flexible printed circuit board 400 comprises: a first copper foil 403 and a polymer layer 402 having a first surface 4021 and a second surface 4022 formed on the surface of the first copper foil 403; an adhesive layer 401 attached to the second surface 4022 of the polymer layer 402 such that the polymer layer 402 is sandwiched between the adhesive layer 401 and the first copper foil 403; and a second copper foil 403' formed on the adhesive layer 401 such that the adhesive layer 401 is sandwiched between the polymer layer 402 and the second copper foil 403', wherein the second copper foil 403' has a cut-off trench 404 for exposing a portion of the adhesive layer 401, and, along the perpendicular direction of the copper foil surface provided for forming the circuit pattern, the area where is not covered by the second copper foil 403' is the bending section.

The double-sided copper foil substrate structure of this invention can be accomplished by the following manufacture steps which are described as follows.

Preparation Example

The Double-Sided Copper Foil Substrate is Manufactured by a Coating/Laminating Process Firstly, a 12 μm thick HA copper foil (made by NIPPON MINING & METALS CO., LTD.) having high thermal resistance and high durable flexibility is provided, and a polyimide is coated on any surface of the copper foil and subsequently is dried to form a polyimide layer having a thickness of 13 μm, and thus a single-sided copper foil is obtained. Next, an adhesive layer is formed on the surface of the polyimide layer with a coating or transferprinting process, and then a precuring process is performed to form a B-stage adhesive layer. Further, another copper foil is attached to the adhesive layer of the abovementioned single-sided copper foil, and subsequently laminated to be closely bonded such that a double-sided copper foil substrate is obtained. At last, the double-sided copper foil substrate is baked for accomplishing the double-sided copper foil substrate product of the present embodiment.

Test Example

Sliding Test on Sliding Table and Rebound Test

Figure 1:
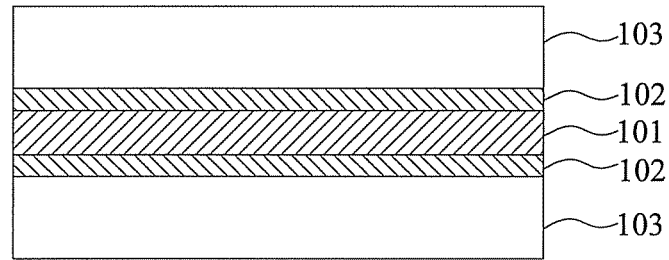
FIG. 1 is a cross-sectional schematic view of a conventional double-sided copper foil substrate structure.
Figure 2:
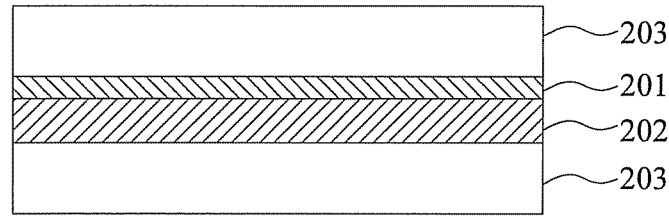
FIG. 2 is a cross-sectional schematic view of another conventional double-sided copper foil substrate substructure.

The double-sided copper foil substrate of this invention and the conventional double-sided copper foil substrate are prepared in accordance with the examples and comparative examples listed in Table 1. Then, an adhesive layer with a thickness of 15 μm and a cover film of polyimide with a thickness of 12.5 μm are respectively attached to the first copper foil as the examples and any one of the copper foils as the comparative examples. Moreover, the number of bending and sliding cycles, the rate of resistance change and the rebound of the substrates are measured in accordance with the following conditions, wherein the double-sided copper foil substrate according to the comparative example as shown in FIG. 2 excludes adhesive layers.

Conditions of Sliding Test on Sliding Table

Each of the manufactured double-sided copper foil substrates is cut into a specimen with 10 mm×30 mm in size. The R angle of the sliding table is set as 0.65 mm; the sliding frequency is 60 cycles/min and the sliding travel is 35 mm. The 100,000 cycles to crack initiation of bending and the rate of resistance change less than 10% are qualified for the test.

Conditions of Rebound Test

Each of the manufactured double-sided copper foil substrates is cut into a specimen with 10 mm×30 mm in size. The copper foil attached with the adhesive layer is removed by etching. And, the R angle is set as 2.35 mm. Each set of the specimens is measured 5 times, and the calculated average values are recited in Table 1.

TABLE 1

|  | Example 1 | Example 2 | Comparative Example 1 | Comparative Example 2 | Comparative Example 3 |
|---|---|---|---|---|---|
| The thickness of copper foil (μm) | 12 | 12 | 12 | 12 | 18 |
| The thickness of polyimide (μm) | 8 | 13 | 20 | 25 | 25 |
| The thickness of adhesive layer (μm) | 8 | 10 | — | — | — |
| The remained thickness after etching the copper foil attached with the adhesive layer (μm) | 29 | 40 | 33 | 40 | 46 |
| Rebound (g) | 4.1 | 5.2 | 7.2 | 8.5 | 13.5 |
| The number of bending and sliding cycles | 100000 | 130000 | unqualified | unqualified | unqualified |
| The rate of resistance change (%) | 6.0% | 4.32% | unqualified | unqualified | unqualified |

As the result of Table 1, each of the composite double-sided copper foil substrates of this invention has an extremely lower rebound, and can satisfy the demand for the number of bending and sliding cycles while the bended R angle is set to a low value of 0.65 mm. Also, the rate of resistance change is less than 10%. In addition, in the preferred embodiment of example 2, the first copper foil using a HA copper foil with high thermal resistance and high durable flexibility, the number of bending cycles until breakage (bending life) have reached up to 130000 cycles but the rate of resistance change is only 4.32%. Therefore, the double-sided copper foil substrate of Example 2 is obviously superior to the double-sided copper foil substrate of the comparative examples in the measured data. In this invention, it is demonstrated that the adhesive layer of an epoxy resin has less influence on the rebound. Therefore, in one preferred embodiment, a preferred thickness of the polymer layer is in the ranged of from 5 to 15 μm, and more preferably 10 to 14 μm. In addition, the first copper foil used with a HA copper foil having high thermal resistance and high durable flexibility can also provide more preferable properties.

From the foregoing, in this invention, the copper substrate manufactured by simplified manufacturing steps, which utilizes an adhesive layer co-operated with a polyimide layer such that the double-sided copper foil substrate of this invention has a lower rebound and satisfies the required number of bending and sliding cycles while the bended R angle is set to a low value of 0.65 mm, is particularly suitable for

The invention claimed is:

1. A composite double-sided copper foil substrate, comprising:
    a polymer layer having a first surface and a second surface opposing the first surface;
    a first copper foil formed on the first surface of the polymer layer;
    an adhesive layer formed on the second surface of the polymer layer such that the polymer layer is sandwiched between and in contact with the adhesive layer and the first copper foil; and
    a second copper foil formed on the adhesive layer such that the adhesive layer is sandwiched between the second copper foil and the polymer layer,
    wherein the polymer layer and the adhesive layer have a total thickness of from 12 to 25 μm.

2. The composite double-sided copper foil substrate of claim 1, wherein the thickness of the adhesive layer is in the range of from 3 to 12 μm.

3. The composite double-sided copper foil substrate of claim 1, wherein the thickness of the first copper foil is in the range of from 8 to 18 μm.

4. The composite double-sided copper foil substrate of claim 1, wherein the first copper foil is a rolled RA copper foil or a HA copper foil with high thermal resistance and high durable flexibility.

5. The composite double-sided copper foil substrate of claim 1, wherein the adhesive layer is made of at least a compound selected from the group consisting of epoxy resin, acrylic resin, urethane resin, silicone rubber resin, poly p-cycloxylene, bimaleimide resin, acrylic resin and polyimide.

6. The composite double-sided copper foil substrate of claim 1, wherein the thickness of the second copper foil is in the range of from 8 to 18 μm.

7. A flexible printed circuit board structure using the composite double-sided copper foil substrate as claimed in claim 1, wherein the second copper foil has a trench for exposing a portion of an adhesive layer from the second copper foil, such that the exposed portion of the adhesive layer is used as a bending section of the printed circuit board.

* * * * *